(12) United States Patent
Gardecki et al.

(10) Patent No.: US 7,288,492 B2
(45) Date of Patent: Oct. 30, 2007

(54) METHOD FOR FORMING INTERCONNECTS ON THIN WAFERS

(75) Inventors: Leonard J. Gardecki, Essex, VT (US); James R. Palmer, Hinesburg, VT (US); Erik M. Probstfield, Fairfax, VT (US); Adolf E. Wirsing, South Hero, VT (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 11/184,695

(22) Filed: Jul. 19, 2005

(65) Prior Publication Data
US 2005/0272241 A1   Dec. 8, 2005

Related U.S. Application Data

(62) Division of application No. 10/604,164, filed on Jun. 28, 2003, now Pat. No. 6,951,775.

(51) Int. Cl.
*H01L 21/00* (2006.01)
*C23C 16/00* (2006.01)

(52) U.S. Cl. .......................... 438/800; 118/728
(58) Field of Classification Search ............... 414/941; 438/800
See application file for complete search history.

(56) References Cited

U.S. PATENT DOCUMENTS

| | | | |
|---|---|---|---|
| 3,458,925 A | 8/1969 | Napier et al. | |
| 4,434,434 A | 2/1984 | Bhattacharya et al. | |
| 5,159,535 A | 10/1992 | Desai et al. | |
| 5,629,564 A | 5/1997 | Nye et al. | |
| 5,961,375 A * | 10/1999 | Nagahara et al. | 451/41 |
| 6,077,764 A * | 6/2000 | Sugiarto et al. | 438/597 |
| 6,133,136 A | 10/2000 | Edelstein et al. | |
| 6,219,910 B1 | 4/2001 | Murali | |
| 6,333,559 B1 | 12/2001 | Costrini et al. | |
| 6,342,434 B1 | 1/2002 | Miyamoto et al. | |
| 6,354,917 B1 | 3/2002 | Ball | |
| 6,528,881 B1 | 3/2003 | Tsuboi | |
| 6,534,387 B1 | 3/2003 | Shinogi et al. | |
| 2003/0213382 A1* | 11/2003 | Kendale et al. | 101/41 |

FOREIGN PATENT DOCUMENTS

JP  2000124177  4/2000

OTHER PUBLICATIONS

BUR919980169 Document, Mendelson et al., Method for Mounting Wafer Frame at Backside Grinding (BSG) Tool, Mar. 1999, 3 pages.

* cited by examiner

*Primary Examiner*—Lex Malsawma
(74) *Attorney, Agent, or Firm*—Schmeiser, Olsen & Watts; William D. Sabo

(57) ABSTRACT

A method of forming a semiconductor interconnect including, in the order recited: (a) providing a semiconductor wafer; (b) forming bonding pads in a terminal wiring level on the frontside of the wafer; (c) reducing the thickness of the wafer; (d) forming solder bumps on the bonding pads; and (e) dicing the wafer into bumped semiconductor chips.

7 Claims, 12 Drawing Sheets

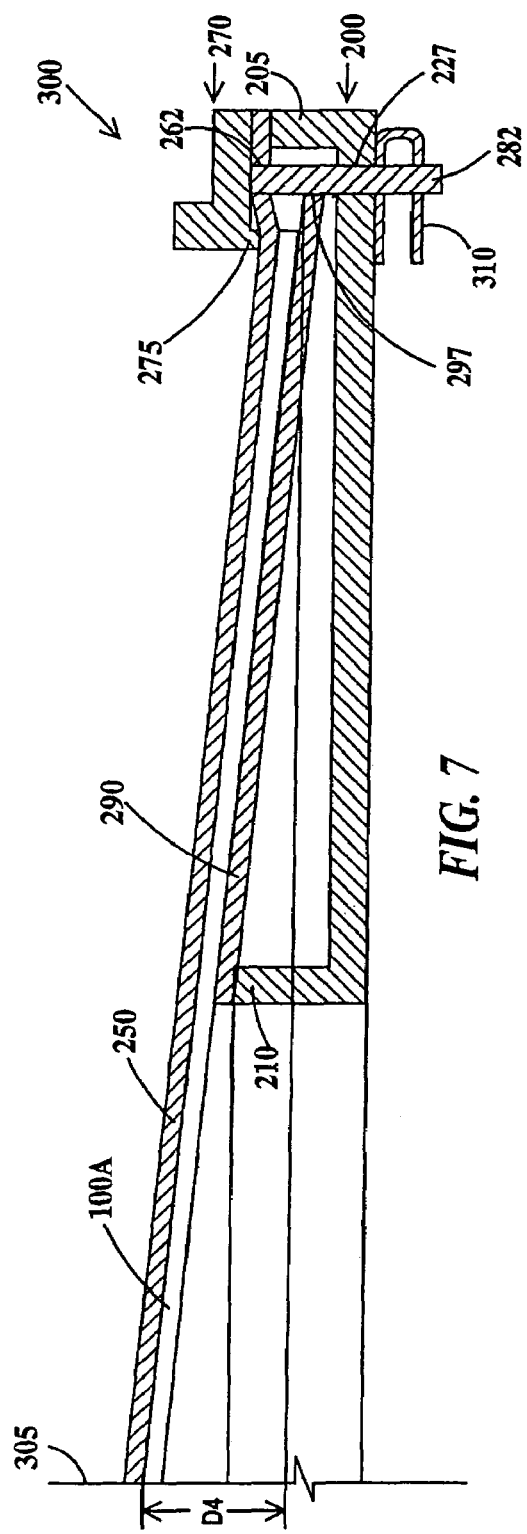
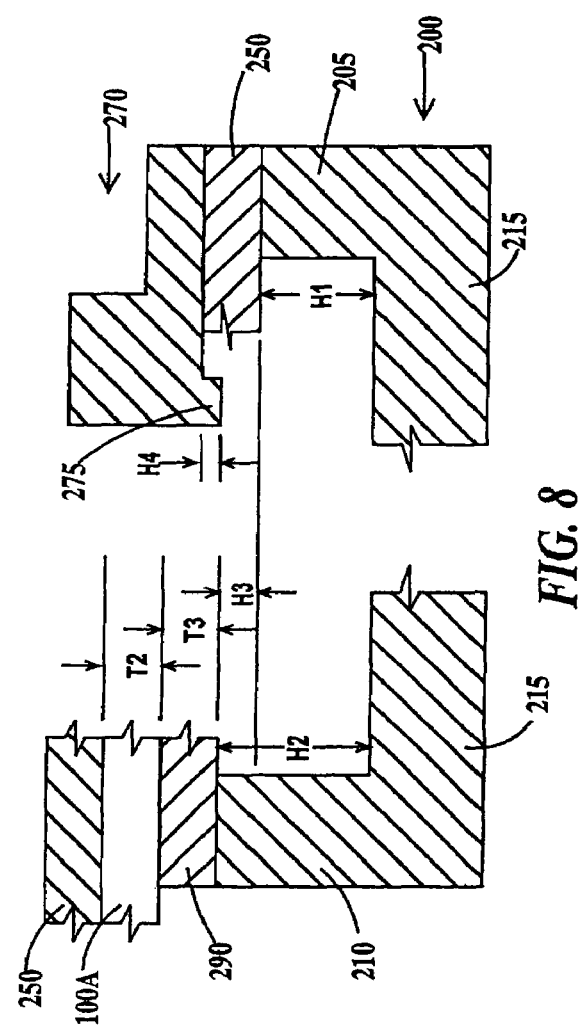
FIG. 7
FIG. 8

METHOD FOR FORMING INTERCONNECTS ON THIN WAFERS

This application is a divisional of Ser. No. 10/604,164 filed on Jun. 28, 2003 now U.S. Pat. No. 6,951,775.

BACKGROUND OF INVENTION

1. Field of the Invention

The present invention relates to the field of semiconductor processing; more specifically, it relates to a method of forming a solder interconnect structure on a thin wafer.

2. Background of the Invention

Increasing density of semiconductor devices has allowed semiconductor chips to decrease in area. Along with the decrease in chip area, has come a need to make the semiconductor chips thinner. Current methods of thinning semiconductor wafers often lead to damage of the semiconductor chips.

SUMMARY OF INVENTION

A first aspect of the present invention is a method of forming a semiconductor interconnect comprising, in the order recited: (a) providing a semiconductor wafer; (b) forming bonding pads in a terminal wiring level on the frontside of the wafer; (c) reducing the thickness of the wafer; (d) forming solder bumps on the bonding pads; and (e) dicing the wafer into bumped semiconductor chips.

A second aspect of the present invention is a method of forming a semiconductor interconnect comprising, in the order recited: (a) providing a semiconductor wafer; (b) forming bonding pads in a terminal wiring level on the frontside of the wafer; (c) reducing the thickness of the wafer to produce a reduced thickness wafer; (d) providing an evaporation fixture comprising a bottom ring, a shim, an evaporation mask and a top ring; (e) placing the shim into the bottom ring; (f) placing the reduced thickness wafer on the shim; (g) placing on and aligning the mask to the reduced thickness wafer; (h) placing said top ring over said mask and temporarily fastening said top ring to said bottom ring; (i) evaporating solder bumps on the bonding pads through the mask; (j) removing the reduced thickness wafer from the fixture; and (k) dicing the reduced thickness wafer into bumped semiconductor chips.

A third aspect of the present invention is A fixture for holding wafer and an evaporative mask comprising: a bottom ring having a inner periphery and an outer periphery, the bottom ring having a raised inner lip formed along the inner periphery and a raised outer lip formed along the outer periphery, the height of the inner lip above a surface of the bottom ring being greater than a height of the outer lip above the surface of the bottom ring; a shim having a inner and an outer periphery, the outer periphery of the shim fitting inside and in proximity to the outer lip of the bottom ring, a bottom surface of the shim proximate to the inner periphery of the shim contacting an upper surface of the inner lip of the bottom ring; a top ring having an inner periphery and an outer periphery, the top ring having a lower raised lip formed along the inner periphery of the bottom ring and extending below a bottom surface of the top ring; and the bottom ring and the top ring adapted to press a bottom surface of the wafer against an upper surface of the shim and to press a top surface of the wafer against a bottom surface of the mask and to press a top surface of the mask proximate to the periphery of the mask against a lower surface of the lower raised lip of the top ring.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 7 is a partial cross-section view through the assembled wafer to mask alignment fixture for forming interconnects according to the present invention; and FIG. 8 is a partial cross-section view through the assembled wafer to mask alignment fixture for forming interconnects illustrating dimensional relationships between the component parts of the wafer to mask alignment fixture according to the present invention.

DETAILED DESCRIPTION

For the purposes of the present invention, the terms substrate and wafer may be used interchangeably.

Figure 1A:
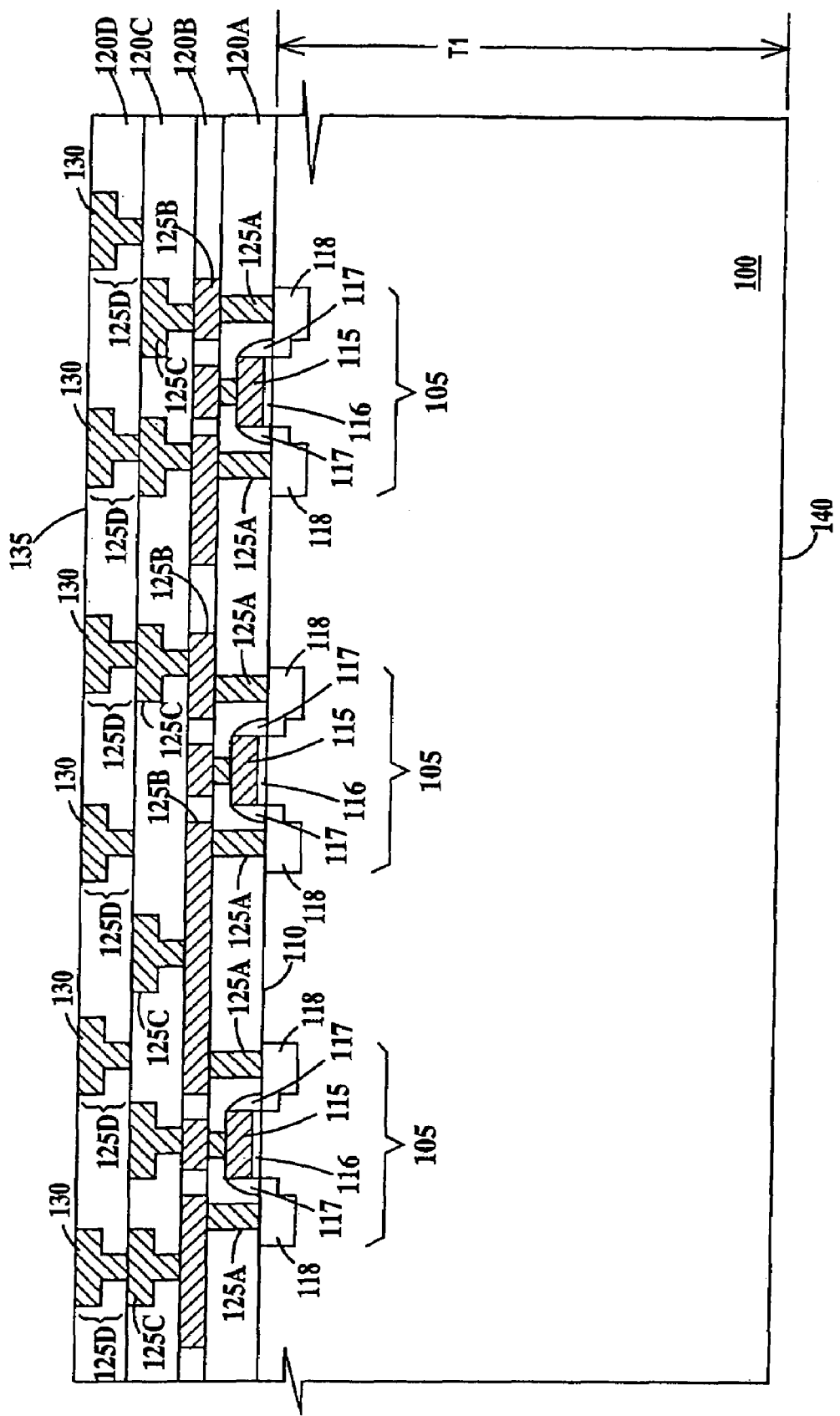
FIGS. 1A through 1F are partial cross-sectional views of the fabrication of a semiconductor wafer according to the present invention.

FIGS. 1A through 1F are partial cross-sectional views of the fabrication of a semiconductor wafer according to the present invention. In FIG. 1A, a substrate 100 such as a semiconductor bulk silicon substrate or a semiconductor silicon-on-insulator (SOI) substrate has a thickness T1. Formed in/on substrate 100 is a multiplicity of active Field effect transistors (FETs) 105. FETs 105 include gate electrodes 115 formed over gate dielectric formed 116 and between spacers 117 on a top surface 110 of substrate 100 and source/drains 118 formed in the substrate. FETs 105 are exemplary of devices and structures normally found in semiconductor circuits of semiconductor chips and many other structures and devices such as capacitors, resistors, inductors, bipolar transistors and diffused and dielectric isolation. FETs 105 are wired into circuits in a first wiring level 120A, a second wiring level 120B, a third wiring level 120C and a terminal wiring level 120D. First wiring level contains contacts 125 interconnecting FETs 105 to conductors 125B in second wiring layer 120B. Conductors 125B are in turn connected to conductors 125C in third wiring level 120C. Conductors 125C are in turn connected to terminal conductors 125D in terminal wiring level 120D. Terminal conductors 125D include a multiplicity of bonding pads 130. Bonding pads 130 are exposed on surface 135 of terminal wiring layer 120D. First wiring level 120A, second wiring level 120B, third wiring level 120C and terminal wiring level 120D are exemplary of wiring levels found in semiconductor chips and more or less wiring levels fabricated by any number of methods well known in the art such as subetch, liftoff, damascene and dual damascene may be used. Substrate 100 has a backside surface 140.

Figure 1B:
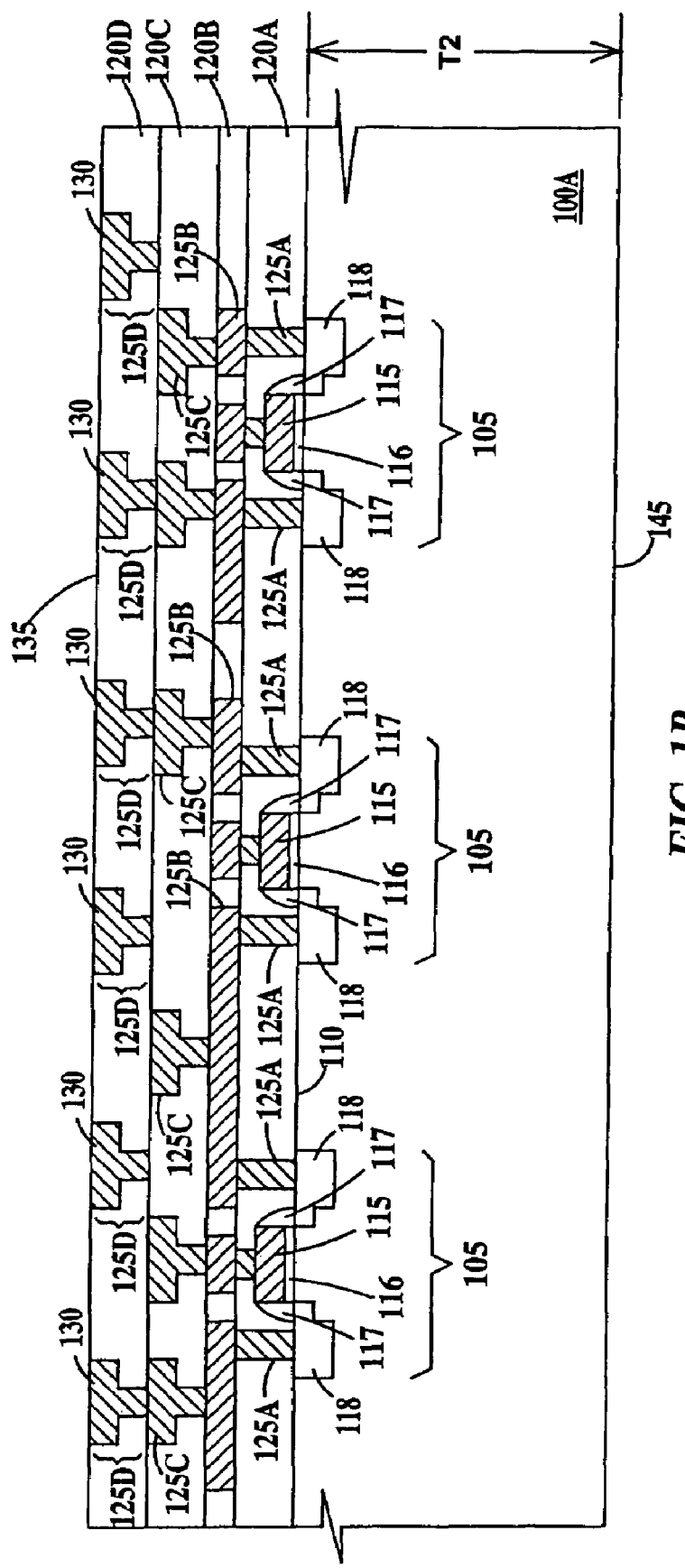

In FIG. 1B, wafer 100A is reduced from thickness T1 (see FIG. 1A) to a new thickness T2 (where T1>T2) by any number of wafer thinning techniques well known in the art. In a first example, backside surface 140 (see FIG. 1A) is ground down to a new backside surface 145 by grinding the backside surface with a rotating diamond grindstone. In a second example, backside surface 140 (see FIG. 1A) is etched down to new backside surface 145 by etching the backside surface with a mixture of hydrofluoric and nitric acids while rotating the wafer. In a third example, backside surface 140 (see FIG. 1A) is lapped down to new backside surface 145 by introducing a slurry containing abrasive particles between the backside of the wafer and a rotating wheel. In a fourth example, backside surface 140 (see FIG. 1A) is chemical-mechanical-polished (CMP) down to new backside surface 145 by introducing a slurry containing abrasive particles mixed with a silicon etchant solution between the backside of the wafer and a rotating wheel.

In one example of thinning, a 200 mm diameter wafer having an initial thickness T1 of about 650 to 780 microns is thinned to a new thickness T2 of about 150 to 450 microns. The present invention may be practiced using any diameter wafer including 100 mm, 125 mm and 300 mm wafer of any initial thickness T1, reducing the wafer to any final thickness T2 as required by the use of the finished chip.

Figure 1C:
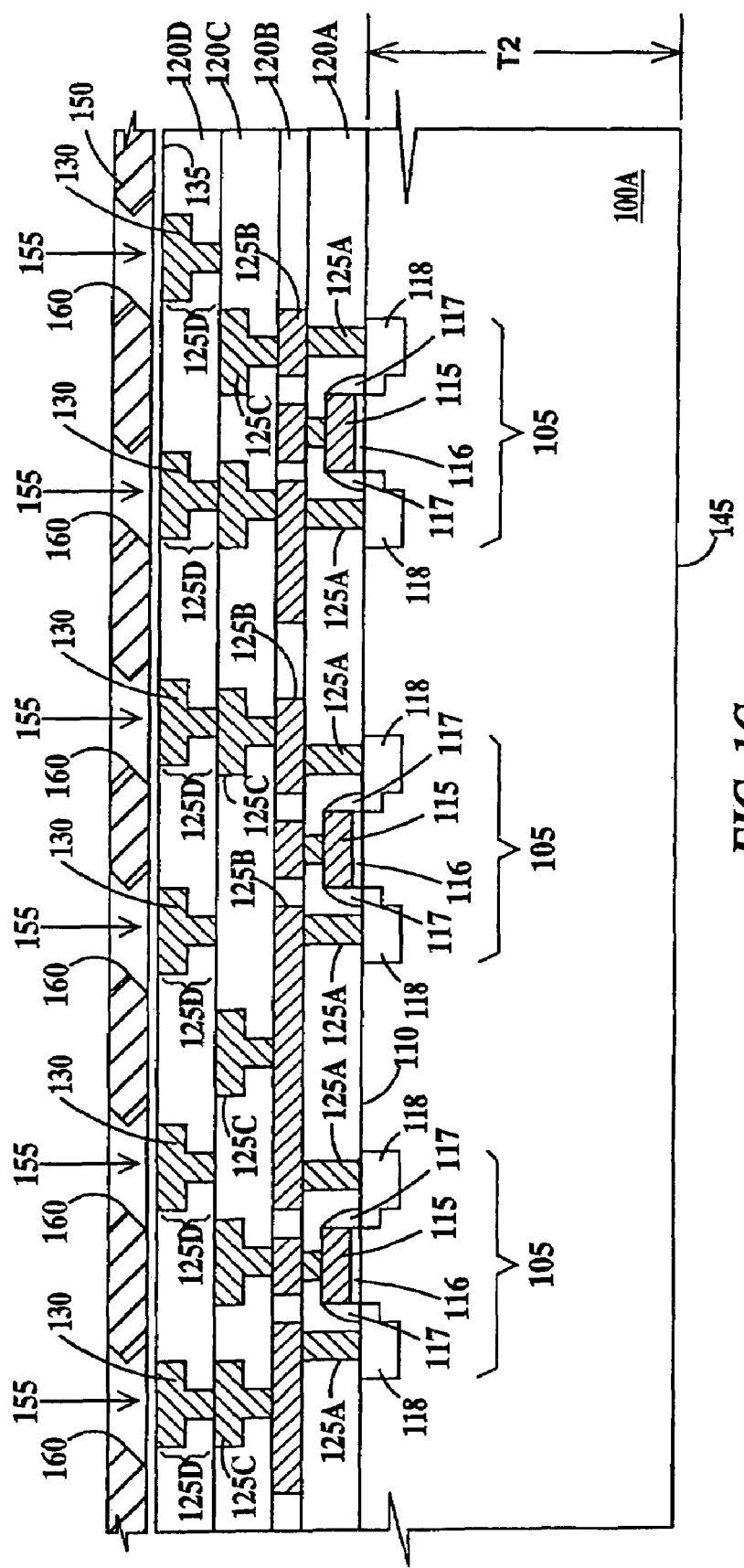

In FIG. 1C an evaporative mask 150 having openings 155 is placed on top surface 135 (or very close to top surface 135) of terminal wiring level 120D. Openings 155 are aligned to bonding pads 130. Openings 155 have inner knife-edges 160. Evaporative mask 150 is typical of the type of mask used to fabricate controlled collapse chip connection (C4) interconnect structures. C4 interconnect structures are also known as solder bump interconnections. In one example, mask 150 is made from molybdenum.

Figure 1D:
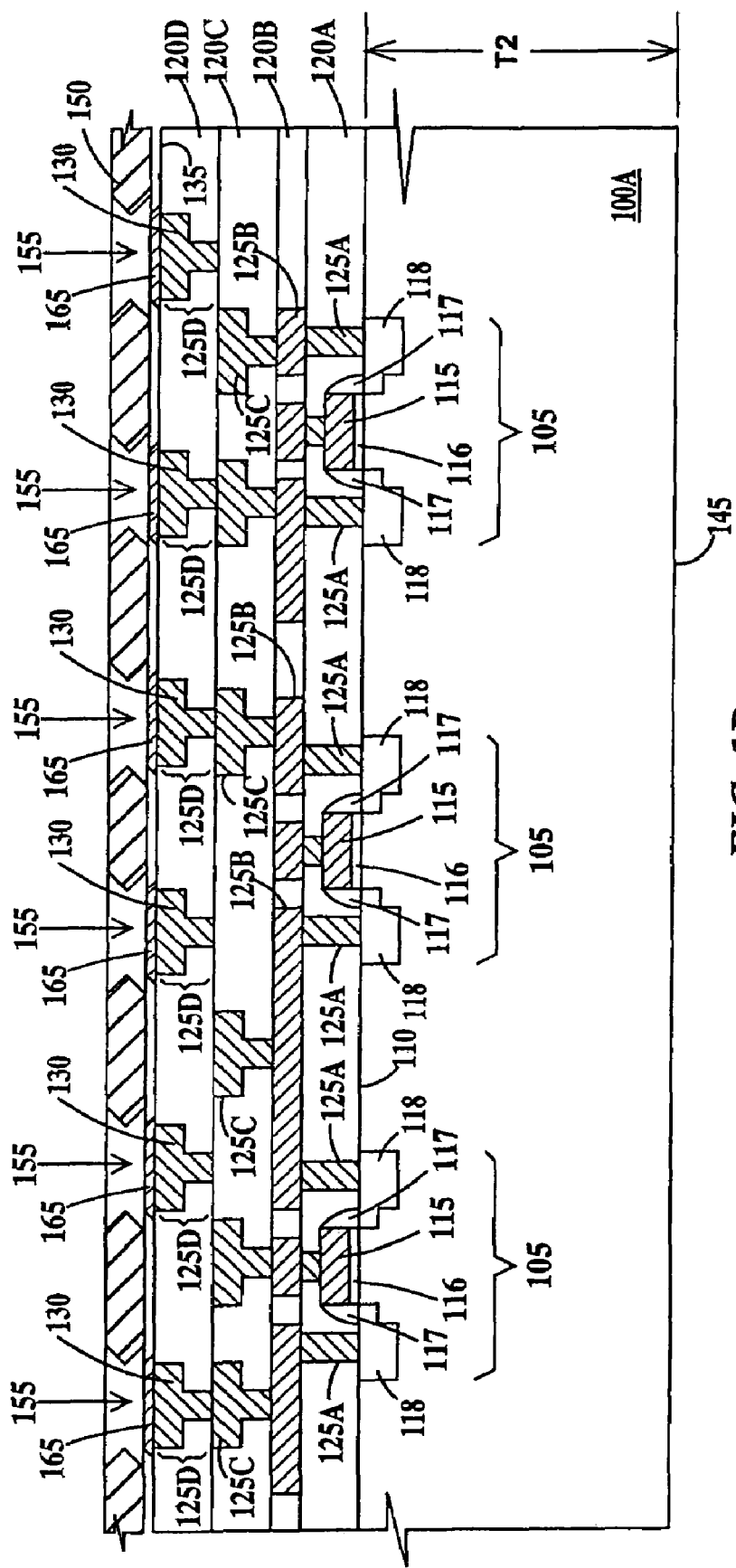

In FIG. 1D, a pad limiting metallurgy (PLM) 165 is evaporated through opening 155 onto bonding pads 130. PLM 165 is discussed more fully infra in reference to FIG. 2. PLM is also known as ball limiting metallurgy (BLM).

Figure 1E:
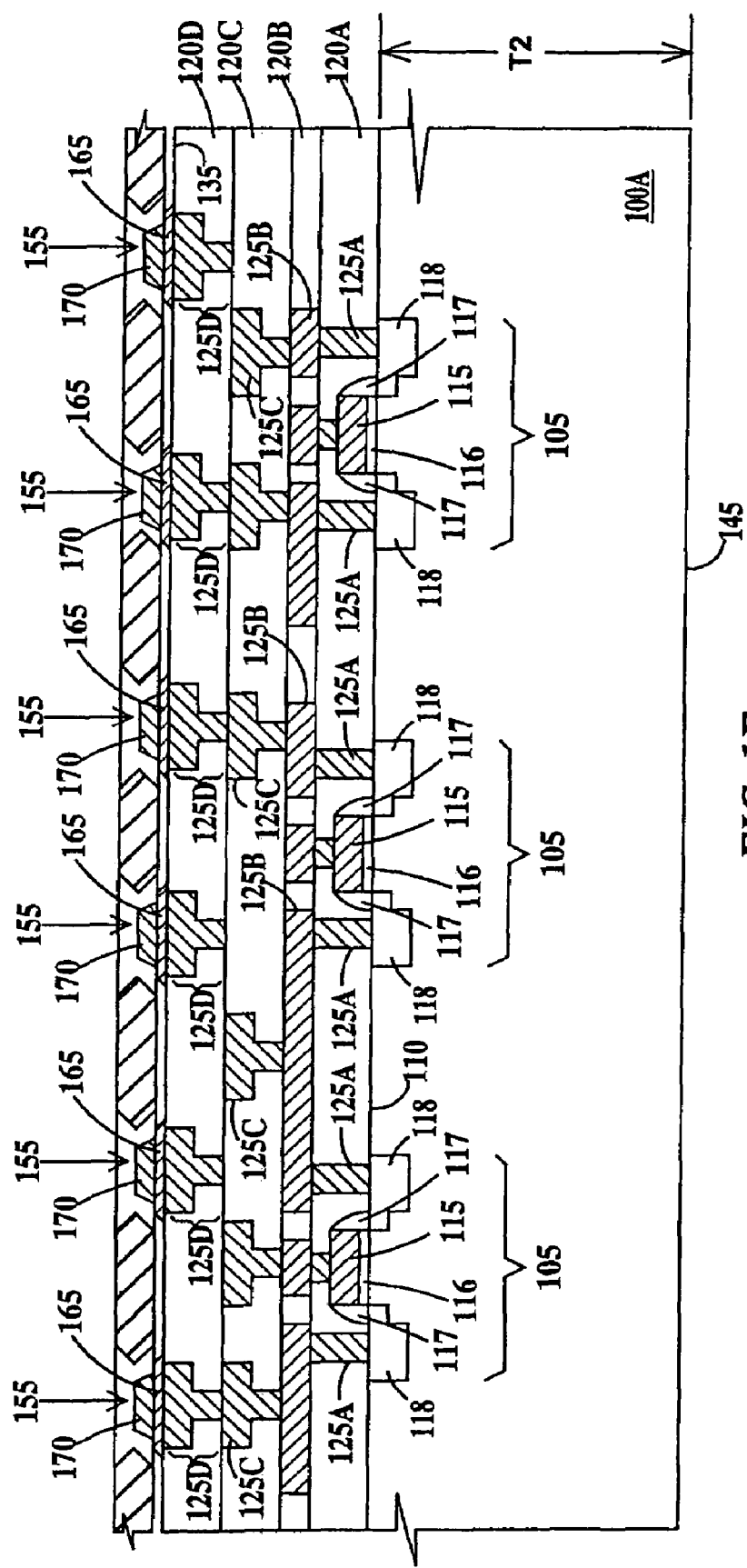

In FIG. 1E, mask 150 is not moved and a solder bump 170 is evaporated through opening 155 onto PLM 165. Solder bump 170 has the shape of a truncated cone.

Figure 1F:
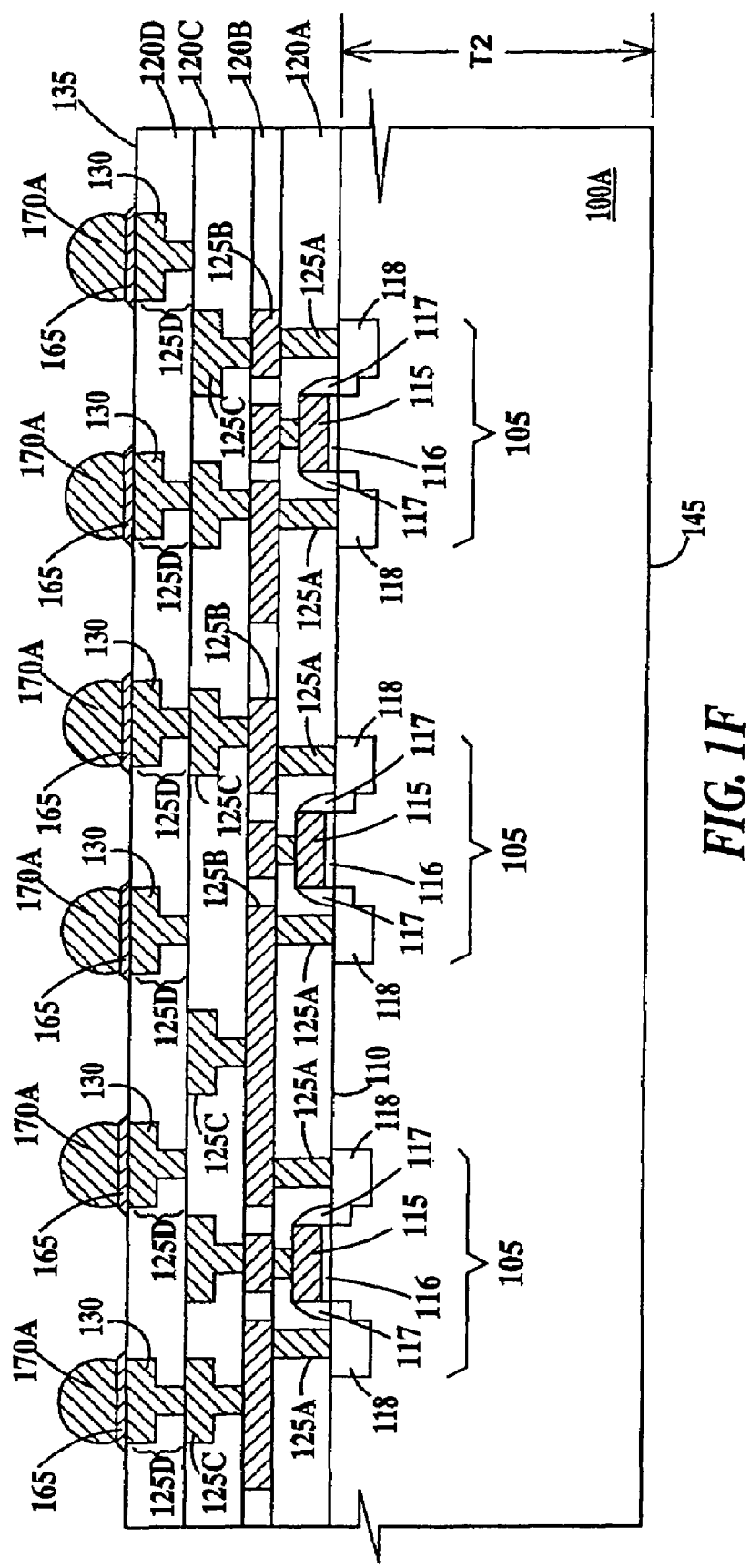

In FIG. 1F, mask 150 (see FIG. 1E) is removed and a reflow anneal is performed in order to reshape solder bumps 170 into semi-spherical solder bumps (also known as solder balls or C4 balls) 170A. Solder bumps 170A are discussed more fully infra in reference to FIG. 2.

Figure 2:
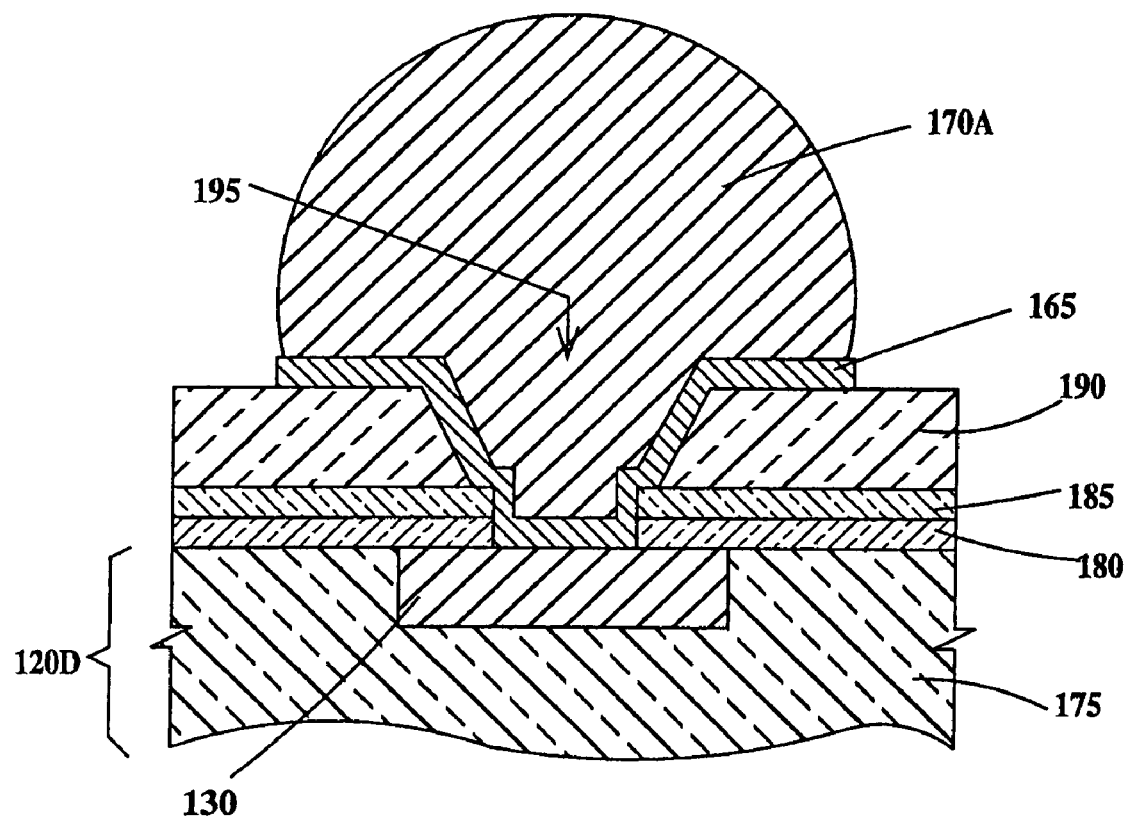
FIG. 2 is a cross-sectional view through an interconnect structure formed by the present invention.

FIG. 2 is a cross-sectional view through an interconnect structure formed by the present invention. In FIG. 2, terminal wiring level 120D includes bonding pad 125D embedded in a dielectric layer 175. In one example, bonding pad 125D is aluminum, copper or alloys thereof. Formed on top of dielectric layer 175 is an optional capping layer 180. In one example, capping layer 180 is silicon nitride. Formed on top of capping layer 180 is an optional passivation layer 185. In one example, passivation layer 185 is silicon dioxide, silicon nitride, silicon oxynitride or combinations thereof. Formed on top of passivation layer 185 is an optional dielectric layer 190. In one example, dielectric layer 190 is polyimide. An optional via 195 is provided through capping layer 180, passivation layer 185 and dielectric layer 190 exposing bonding pad 125D in terminal wiring level 120D. Via 195 may be formed by any number of well known plasma etch techniques. PLM 165 is formed over dielectric layer 190, sidewalls of via 195 and exposed portions of terminal wiring level 120D. In one example, PLM 165 is titanium nitride, copper, gold, titanium-tungsten, chrome, chrome-copper or combinations thereof. A typical combination is gold over copper over chrome. Another typical combination is copper over chrome copper over titanium-tungsten. PLM 165 is in electrical contact with bonding pad 130. C4 ball 170A is formed on and in electrical contact with PLM 165. Examples of C4 ball 170A compositions include but are not limited to 95% lead and 5% tin, 97% lead and 3% tin, 100% lead, other lead alloys, 100% tin and tin alloys. In one example, the reflow anneal mentioned supra is performed at a temperature of between about 350° C. and 380

The evaporation process for forming PLMs 165 and solder bumps 170 (see FIG. 1E) is performed by placing the semiconductor substrate in wafer to mask alignment fixture that allows alignment of mask 150 to thinned substrate 100A (see FIG. 1E). The evaporation process includes loading multiple wafer to mask alignment fixtures (with wafers and masks and in the case of the present invention, shims) into spaces in a dome of a multi-source evaporator and each material of PLM and then the solder pad are evaporated onto contacts pads on the wafer through holes in a mask. Such a wafer to mask alignment fixture is illustrated in FIGS. 3A, 3B, 4, 5A, 5B, 6A and 6B and described infra.

Figure 3A:
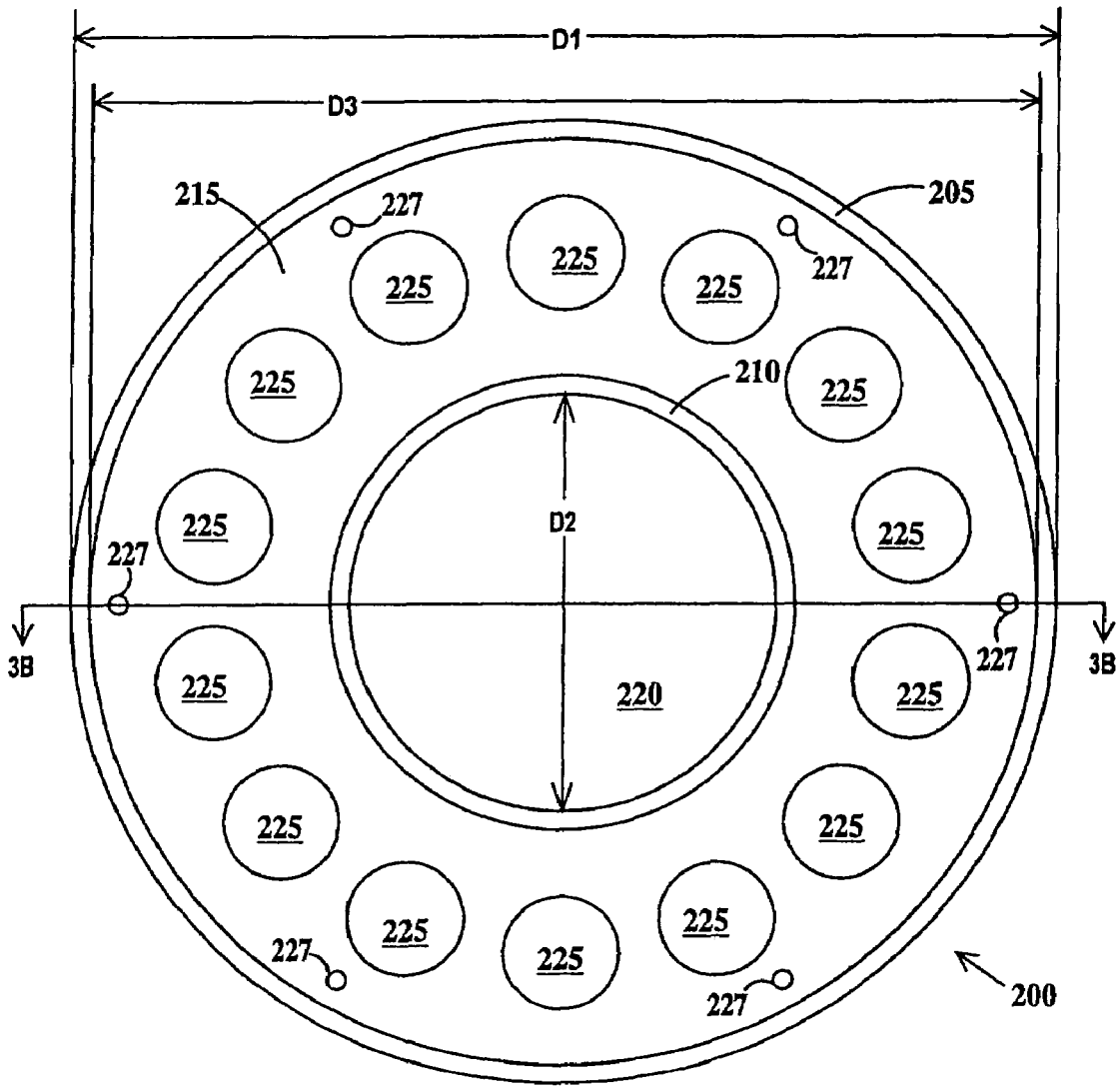
FIG. 3A is a top view of a base portion of a wafer to mask alignment fixture for forming interconnects according to the present invention.
Figure 3B:
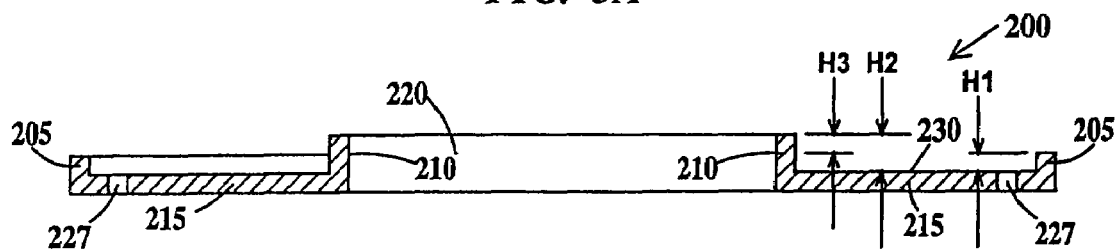
FIG. 3B is a cross-section view through line 3B-3B of FIG. 3A.

FIG. 3A is a top view of a base portion of a wafer to mask alignment fixture for forming interconnects according to the present invention and FIG. 3B is a cross-section view through line 3B-3B of FIG. 3A. In FIGS. 3A and 3B, a bottom ring 200 includes an outer lip 205 and an inner lip 210 joined by an integral plate portion 215. Inner lip 210 defines the extent of an opening 220 centered in bottom ring 200. Plate portion 215 includes a multiplicity of openings 225 and a multiplicity of retaining post holes 227. Opening 220 provides access for a wafer handling fixture (not shown) and openings 225 are for thermal expansion and heat retention control. Bottom ring 200 has a diameter D1 and opening 220 has a diameter D2. The inside distance between opposite points on outer lip 205 is D3. Outer lip 205 has a height H1 measured from a top surface 230 of plate portion 215 and inner lip 210 has a height H2 measured from the top surface of the plate portion. The difference in height between outer lip 205 and inner lip 210 is H3 where H3=H2−H1 and H2 is greater than H1. In one example, for an standard un-thinned 200 mm diameter wafer about 650 microns thick, H2 is about 0.080 inches and H1 is about 0.073 inches, making H3 about 0.007 inches. H1 and H2 will vary based on wafer diameters and standard un-thinned wafer thickness.

Figure 4:
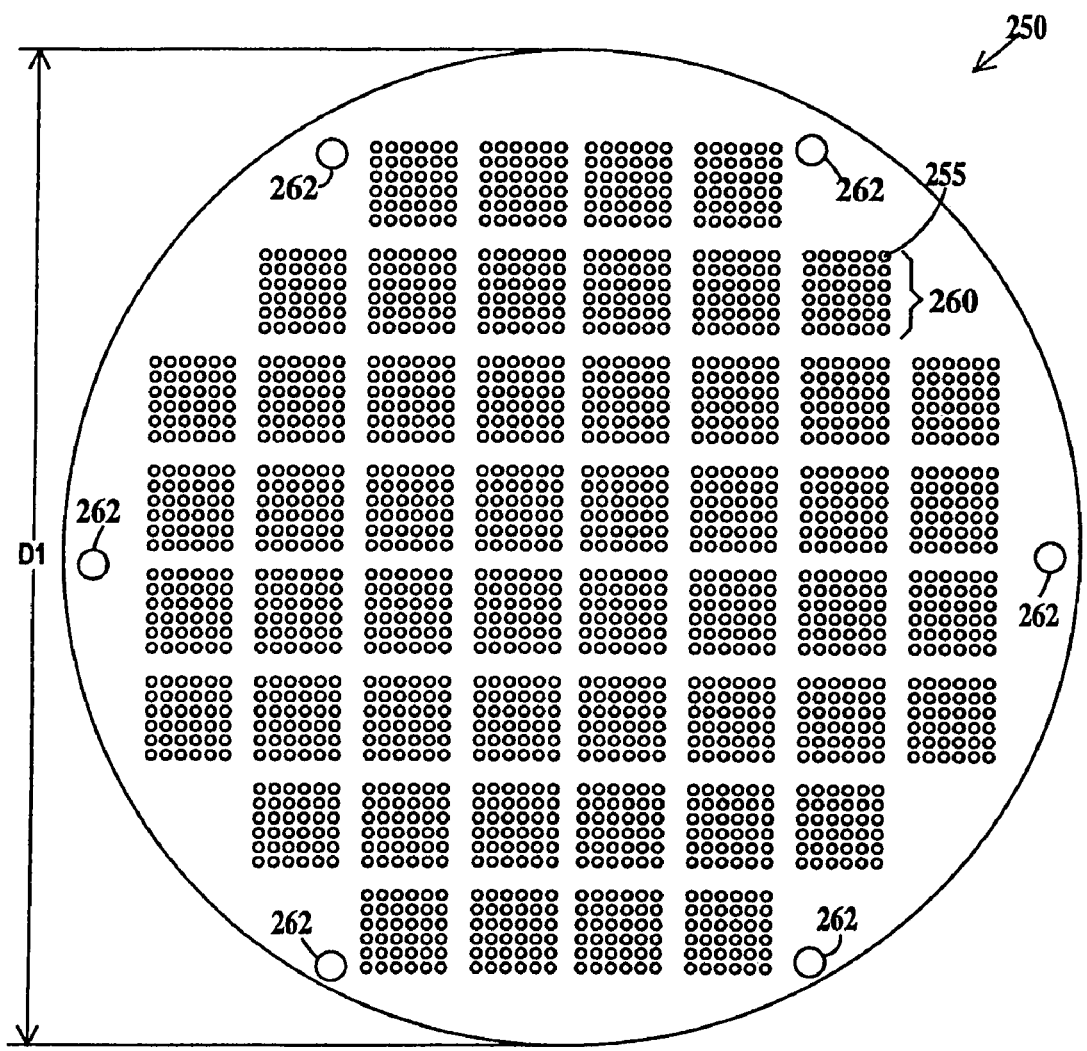
FIG. 4 is a top view of an evaporative mask portion of the wafer to mask alignment fixture for forming interconnects according to the present invention.

FIG. 4 is a top view of an evaporative mask portion of the wafer to mask alignment fixture for forming interconnects according to the present invention. In FIG. 4, mask 250 includes a multiplicity of openings 255 arranged in groups 260. Each group 260 corresponds to a chip on a wafer that will be placed under mask 250 as illustrated in FIG. 7 and described infra. Mask 250 has a diameter of D1, the same as the diameter of bottom ring 200 illustrated in FIG. 3A and described supra. Mask 250 includes a multiplicity of retaining post holes 262.

Figure 5A:
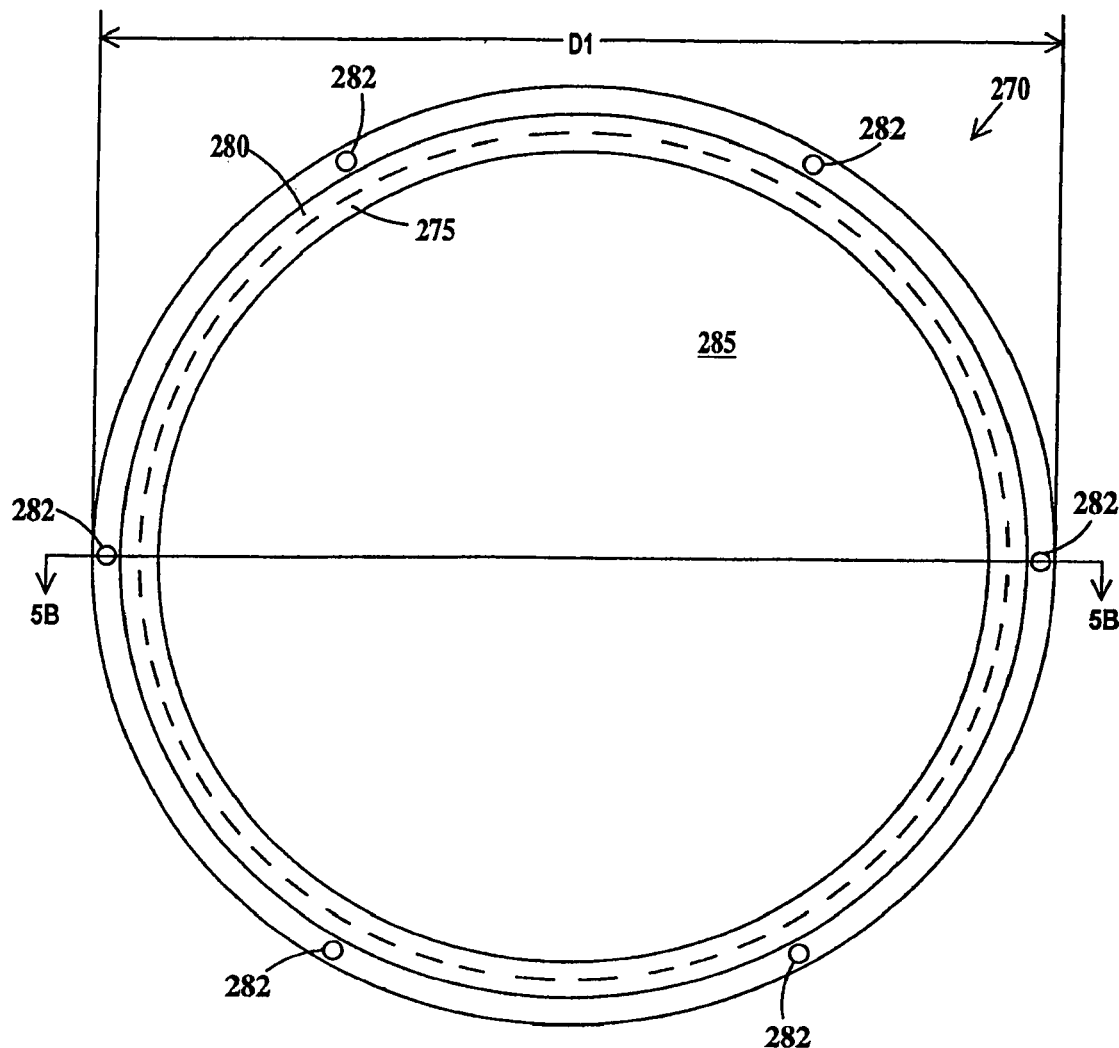
FIG. 5A is a top view of a top portion of the wafer to mask alignment fixture for forming interconnects according to the present invention.
Figure 5B:
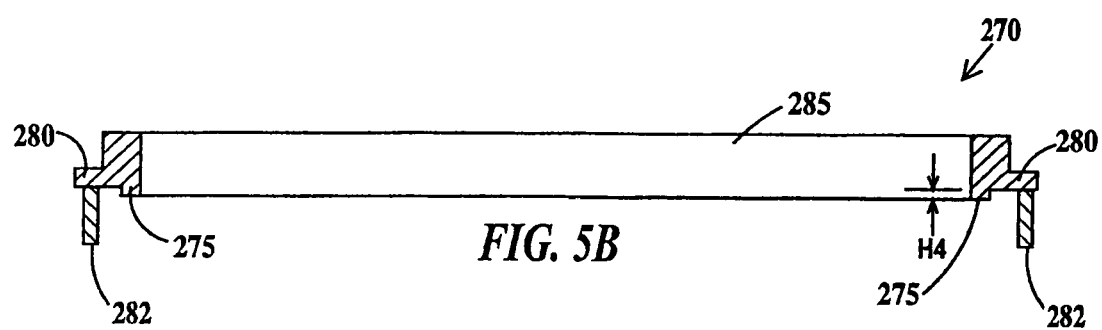
FIG. 5B is a cross-section view through line 5B-5B of FIG. 5A.

FIG. 5A is a top view of a top portion of the wafer to mask alignment fixture for forming interconnects according to the present invention and FIG. 5B is a cross-section view through line 5B-5B of FIG. 5A. In FIGS. 5A and 5B, top ring 270 has a lower lip 275 protruding from a bottom surface 280 of the top ring. Lower ring 275 protrudes a distance H4. In one example, for a standard 200 mm diameter wafer having a thickness of about 650 microns, H4 is about 0.002 inches. Top ring 270 includes an opening 280 centered within ring 270. Top ring 270 has a diameter of D1, the same as the diameter of bottom ring 200 illustrated in FIG. 3A and described supra. Top ring 270 includes a multplicity of retaining posts 282.

Figure 6A:
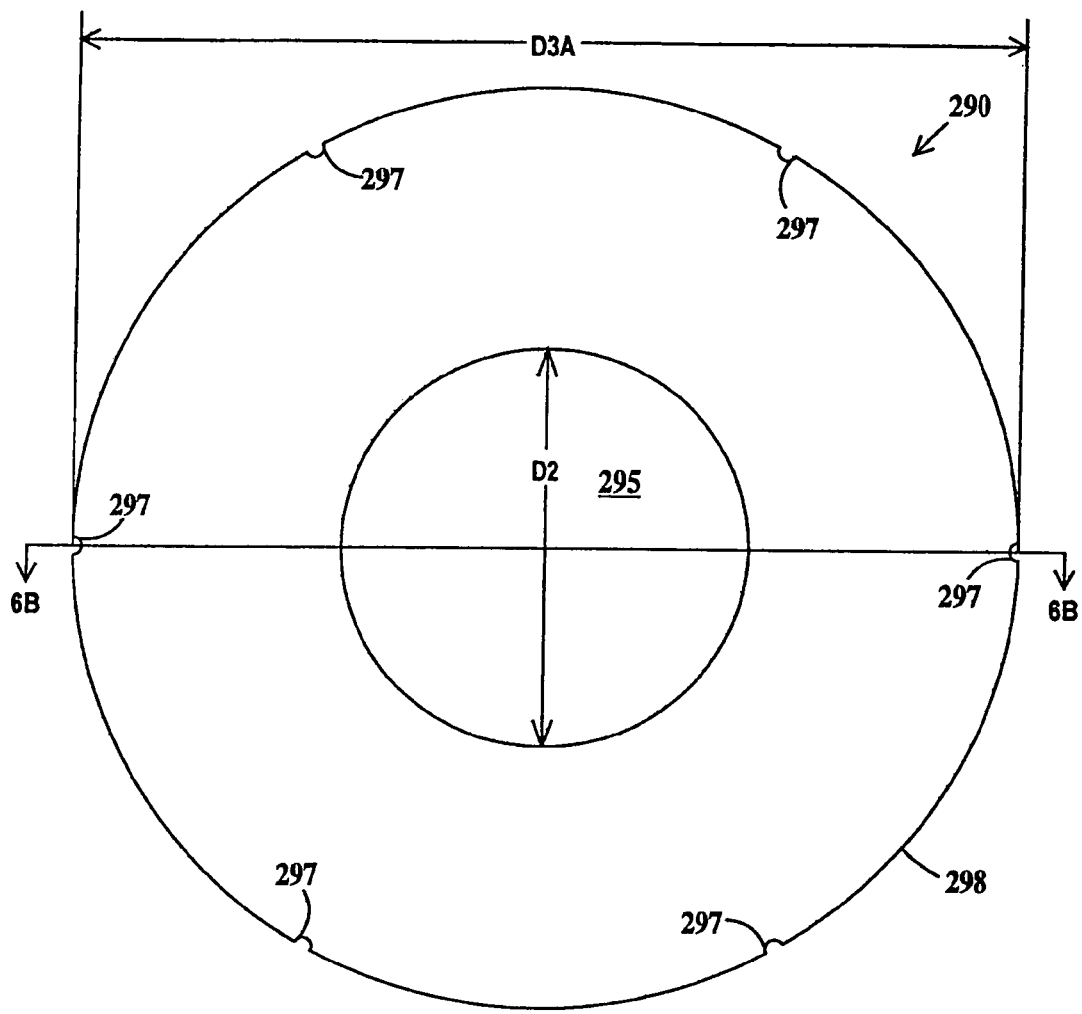
FIG. 6A is a top view of a shim portion of a wafer to mask alignment fixture for forming interconnects according to the present invention.
Figure 6B:
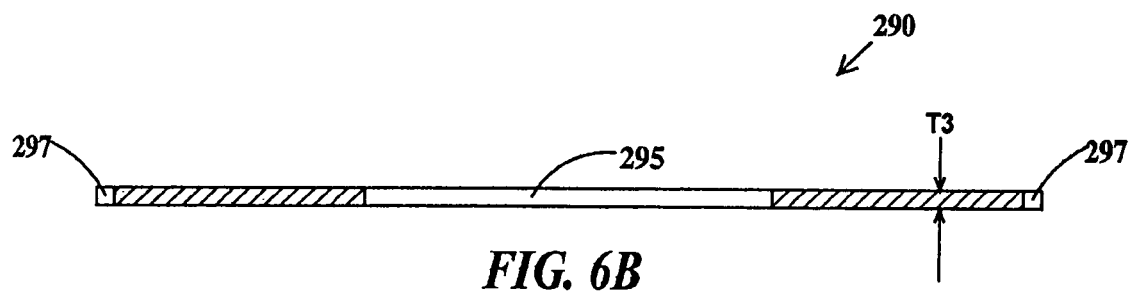
FIG. 6B is a cross-section view through line 6B-6B of FIG. 6A.

FIG. 6A is a top view of a shim portion of a wafer to mask alignment fixture for forming interconnects according to the present invention and FIG. 6B is a cross-section view through line 6B-6B of FIG. 6A. In FIGS. 6A and 6B a shim 290 has an opening 295 centered within the shim. Shim 290 has a diameter D3A where D3A is just slightly smaller than D3, the inside distance between opposite points on outer lip 205 (see FIG. 3A). D3 is greater than the diameter of the wafer being held in the fixture. Opening 295 has a diameter D2 the same as the diameter of opening 220 of bottom ring 200 illustrated in FIG. 3A and described supra. Shim 290 has a thickness T3. Shim 290 includes a multiplicity of retaining post notches 297 in a perimeter 298 of the shim.

FIG. 7 is a partial cross-section view through the assembled wafer to mask alignment fixture for forming interconnects according to the present invention. In FIG. 7, only half of the assembled fixture 300 (about centerline 305) is illustrated. To load/assemble fixture 300, shim 290 is placed in bottom ring 200 (contacting inner lip 210), thinned substrate 100A is placed on shim 290, mask 250 is placed on thinned substrate 100A and top ring 270 is placed on mask 250. Mask 250 is pressed between top ring 270 and outer lip 205 of bottom ring 200 and lower lip 275 of the top ring presses on mask 250. The only portion of bottom ring 200 contacted by shim 290 is inner lip 210. Clips (not shown) hold assembled fixture 300 together. Also, alignment pins and alignment holes in bottom and top rings 200 and 270 and alignment holes in mask 250 and shim 290 are present but not illustrated in FIG. 7. The combination of the difference in heights between outer and inner lips 205 and 210 of bottom ring 200 and the height of lower lip 275 of top ring 270 deflects (or bows) shim 290, substrate 100A and mask 250 into very shallow but semi-spherical shapes by pressing the peripheries of mask 250 and substrate 100A towards bottom ring 200. The degree of deflection of substrate 100A is D4 measured along the top surface of substrate 100A. The bow imparted to substrate 100A prevents or reduces such problems associated with evaporation through an knife edge opening in a mask such as sputter haze, PLM flaring and solder pad haloing.

Retaining post 282 passes through retaining post hole 262 in mask 250, retaining post notches 297 in shim 290 and retaining post hole 227 in bottom ring 200. A spring clip 310 engages retaining post 305 and temporarily fastens assembled fixture 300 together.

FIG. 8 is a partial cross-section view through the assembled wafer to mask alignment fixture for forming interconnects illustrating dimensional relationships between the component parts of the wafer to mask alignment fixture according to the present invention. The dimensions H1, H2 of outer and inner lips 205 and 210 of bottom ring 200 and the dimension H4 of lower lip 275 of top ring 270 (see FIG. 5A) are experimentally determined for each combination of wafer diameter and standard un-thinned wafer thickness. Note it is possible that one wafer manufacturer may produce standard 200 mm diameter wafers that are 780 microns thick, while another manufacturer may produce standard 200 mm diameter wafers that are 640 microns thick. Either two sets of fixtures having different values of H1, H2 and H4 are required, or 640 micron thick wafers are treated as thin wafers compared to the 780 micron thick wafers and a single fixture is designed for 780 micron thick wafers. There are two methods of determining the thickness T3 for shim 290. The first method is to use the formula T3 (shim thickness) equals T1 (un-thinned or standard wafer thickness that fixture is designed for) minus T2 (thinned wafer thickness). For example, assume a fixture designed for a 200 mm diameter 640 micron thick having values of 0.073 for H1, 0.080 for H2 and 0.002 for H4. If the wafer has been thinned to 250 microns, then T3 will be 390 microns (640−250=390) even if the original thickness of the wafer was greater than 640 microns. If the fixture had been designed for a 780 micron thick wafer than shim 290, in the present example, would be 530 microns (720−250=530) thick.

The second method is to experimentally determine for a given thinned wafer thickness (T2) a shim thickness (T3) that yields the same wafer deflection (D4) (see FIG. 7) as the un-thinned standard wafer (of thickness T1) that the fixture was designed for. For example assume a fixture designed for a 200 mm diameter 640 micron thick having values of 0.073 for H1, 0.080 for H2 and 0.002 for H4. If the wafer has been thinned to 250 microns, then T3 will be selected from an experimentally determined table of shim thickness (T3) versus thinned wafer thickness (T2) versus wafer deflection (D4) to give the same wafer deflection (D4) with a shim in place as a 640 micron thick wafer even if the original thickness of the wafer was not equal to 640 microns.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The invention claimed is:

1. A fixture for holding a wafer and an evaporative mask comprising:

a bottom ring having a inner periphery and an outer periphery, said bottom ring having a raised inner lip formed along said inner periphery and a raised outer lip formed along said outer periphery, the height of said inner lip above a surface of said bottom ring being greater than a height of said outer lip above said surface of said bottom ring;

a shim having a inner and an outer periphery, the outer periphery of said shim fitting inside and in proximity to said outer lip of said bottom ring, a bottom surface of said shim proximate to said inner periphery of said shim contacting an upper surface of said inner lip of said bottom ring;

a top ring having an inner periphery and an outer periphery, said top ring having a lower raised lip formed along said inner periphery of said bottom ring and extending below a bottom surface of said top ring; and said bottom ring and said top ring adapted to press a bottom surface of said wafer against an upper surface of said shim and to press a top surface of said wafer against a bottom surface of said evaporative mask and to press a top surface of said evaporative mask proximate to said periphery of said evaporative mask against a lower surface of said lower raised lip of said top ring.

2. The fixture of claim 1, wherein said shim, said top ring and said bottom ring are adapted to impart a bow to said wafer and said evaporative mask, a central part of said wafer and a central part of said evaporative mask bowed away from said bottom ring and peripheral portions of said wafer and said evaporative mask bowed toward said bottom ring.

3. A fixture, comprising:
- a bottom ring having opposite top and bottom surfaces and inner and outer raised lips on said top surface;
- a shim having a circular opening and opposite top and bottom surfaces;
- a top ring having opposite top and bottom surface surfaces;
- said bottom ring and said top ring adapted to press said bottom surface of said shim adjacent to said circular opening against said inner raised lip, to press a bottom surface of a wafer against said upper surface of said shim, to press a top surface of said wafer against a bottom surface of a mask and to press a top surface of said mask proximate to a periphery of said mask against said lower surface of said top ring; and
- wherein said shim, said top ring and said bottom ring are adapted to impart a bow to said wafer and said mask, a central part of said wafer and a central part of said mask bowed away from said bottom ring and peripheral portions of said wafer and said mask bowed toward said bottom ring.

4. The fixture of claim 3, wherein said inner raised lip extends a first distance above said top surface of said bottom ring, said outer raised lip extends a second distance above said top surface of said bottom ring, said first distance is greater than said second distance.

5. A fixture, comprising:
- a bottom ring having a inner periphery and an outer periphery, said bottom ring having a raised inner lip formed along said inner periphery and a raised outer lip formed along said outer periphery, a height of said inner lip above a surface of said bottom ring being greater than a height of said outer lip above said surface of said bottom ring;
- a shim having a inner and an outer periphery, the outer periphery of said shim fitting inside and in proximity to said outer lip of said bottom ring, a bottom surface of said shim proximate to said inner periphery of said shim contacting an upper surface of said inner lip of said bottom ring; and
- a top ring having an inner periphery and an outer periphery, said top ring having a lower raised lip formed along said inner periphery of said bottom ring and extending below a bottom surface of said top ring.

6. The fixture of claim 5, wherein said height of said inner lip is about 0.080 inches and said height of said outer lip is about 0.073 inches.

7. The fixture of claim 5, wherein said bottom ring includes openings extending between said surface and an opposite surface of said bottom ring, said opening located between said inner and outer lips.

* * * * *